(12) United States Patent
Hiscock et al.

(10) Patent No.: US 11,250,890 B2
(45) Date of Patent: *Feb. 15, 2022

(54) MEMORY WITH CONFIGURABLE DIE POWERUP DELAY

(71) Applicant: Micron Technology, Inc., Boise, ID (US)

(72) Inventors: Dale H. Hiscock, Boise, ID (US); Michael Kaminski, Boise, ID (US); Joshua E. Alzheimer, Boise, ID (US); John H. Gentry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/183,202

(22) Filed: Feb. 23, 2021

(65) Prior Publication Data

US 2021/0174842 A1    Jun. 10, 2021

Related U.S. Application Data

(63) Continuation of application No. 16/502,571, filed on Jul. 3, 2019, now Pat. No. 10,937,468.

(51) Int. Cl.
| G11C 5/14 | (2006.01) |
| G11C 7/22 | (2006.01) |
| G11C 11/408 | (2006.01) |
| G11C 11/4076 | (2006.01) |
| G11C 11/4074 | (2006.01) |

(52) U.S. Cl.
CPC .............. *G11C 5/148* (2013.01); *G11C 7/222* (2013.01); *G11C 11/4074* (2013.01); *G11C 11/4076* (2013.01); *G11C 11/4087* (2013.01)

(58) Field of Classification Search
CPC . G11C 5/148; G11C 11/4074; G11C 11/4076; G11C 11/4087; G11C 7/222
See application file for complete search history.

(56) References Cited

U.S. PATENT DOCUMENTS

| 4,601,018 | A | 7/1986 | Baum et al. |
| 5,535,169 | A | 7/1996 | Endo et al. |
| 10,504,577 | B1 | 12/2019 | Alzheimer |
| 10,593,392 | B1 | 3/2020 | Johnson et al. |
| 10,622,052 | B2 | 4/2020 | Vankayala |
| 10,937,468 | B2 * | 3/2021 | Hiscock .............. G11C 11/4087 |
| 2005/0111282 | A1 | 5/2005 | Dono et al. |
| 2006/0069855 | A1 | 3/2006 | Ha et al. |
| 2009/0084838 | A1 * | 4/2009 | Ruby ........................ G11C 7/20 235/375 |

(Continued)

*Primary Examiner* — Toan K Le
(74) *Attorney, Agent, or Firm* — Perkins Coie LLP

(57) ABSTRACT

Memory devices and systems with configurable die powerup delay, and associated methods, are disclosed herein. In one embodiment, a memory system includes two or more memory dies. At least one memory die has a powerup group terminal and powerup group detect circuitry. The powerup group detect circuitry is configured to detect a powerup group assigned to the at least one memory die. The at least one memory die is configured to delay its powerup operation by a time delay corresponding to the powerup group to which it is assigned. In this manner, powerup operations of the two or more memory dies can be staggered to reduce peak current demand of the memory system.

20 Claims, 5 Drawing Sheets

(56) References Cited

U.S. PATENT DOCUMENTS

| | | | |
|---|---|---|---|
| 2009/0296310 A1* | 12/2009 | Chikara | ................. H01L 24/73 |
| | | | 361/301.4 |
| 2009/0307476 A1* | 12/2009 | Khatri | ...................... G06F 1/26 |
| | | | 713/2 |
| 2010/0182863 A1 | 7/2010 | Fukiage | |
| 2011/0320700 A1 | 12/2011 | Bronson et al. | |
| 2012/0008434 A1 | 1/2012 | Park | |
| 2013/0272082 A1 | 10/2013 | Kim et al. | |
| 2014/0160867 A1 | 6/2014 | Veches et al. | |
| 2015/0070056 A1 | 3/2015 | Tanadi | |
| 2015/0179247 A1 | 6/2015 | Meinerzhagen et al. | |
| 2015/0279443 A1 | 10/2015 | Park | |
| 2015/0380073 A1 | 12/2015 | Joo et al. | |
| 2016/0078918 A1 | 3/2016 | Hyun et al. | |
| 2017/0068584 A1 | 3/2017 | Park et al. | |
| 2017/0069371 A1 | 3/2017 | Shin et al. | |
| 2017/0110178 A1 | 4/2017 | Bains | |
| 2017/0148133 A1 | 5/2017 | Sumihiro et al. | |
| 2018/0096719 A1 | 4/2018 | Tomishima et al. | |
| 2018/0096735 A1 | 4/2018 | Pappu | |
| 2018/0096979 A1 | 4/2018 | Pappu et al. | |
| 2019/0130960 A1 | 5/2019 | Kim | |
| 2019/0179698 A1 | 6/2019 | Liu et al. | |
| 2020/0019458 A1 | 1/2020 | Cadloni et al. | |
| 2020/0066328 A1 | 2/2020 | Fu et al. | |
| 2020/0075087 A1 | 3/2020 | Vankayala | |
| 2020/0105318 A1 | 4/2020 | Mobin et al. | |
| 2020/0168268 A1 | 5/2020 | Bessho et al. | |
| 2020/0194057 A1 | 6/2020 | Ishikawa et al. | |

* cited by examiner

MEMORY WITH CONFIGURABLE DIE POWERUP DELAY

CROSS-REFERENCE TO RELATED APPLICATIONS

This application is a continuation of U.S. patent application Ser. No. 16/502,571, filed Jul. 3, 2019; which is incorporated herein by reference in its entirety.

TECHNICAL FIELD

The present disclosure is related to memory systems, devices, and associated methods. In particular, the present disclosure is related to memory devices with configurable die powerup delay, and associated systems and methods.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
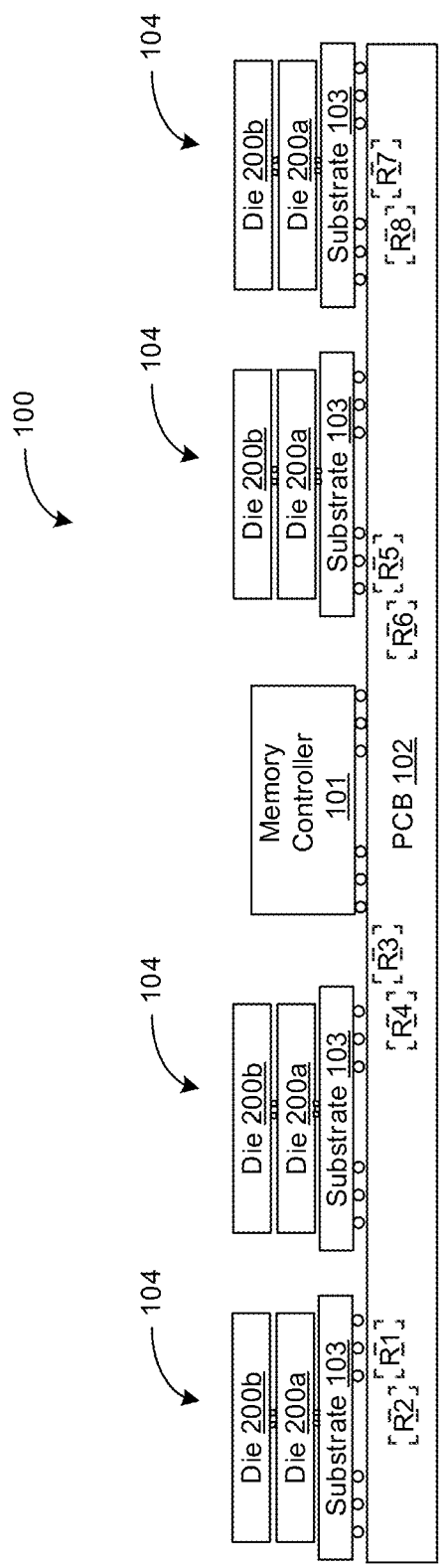
FIG. 1 is a block diagram schematically illustrating a memory system configured in accordance with various embodiments of the present technology.

As discussed in greater detail below, the technology disclosed herein relates to memory systems and devices (and associated methods) configured to powerup memory dies in groups at different times when an external powerup voltage is supplied to the memory devices and systems. In this manner, the memory devices and systems disclosed herein reduce the peak current demanded on the power supply during powerup of the memory system. A person skilled in the art, however, will understand that the technology may have additional embodiments and that the technology may be practiced without several of the details of the embodiments described below with reference to FIGS. 1-5. In the illustrated embodiments below, the memory systems and devices are primarily described in the context of devices incorporating DRAM storage media. Memory systems and devices configured in accordance with other embodiments of the present technology, however, can include other types of memory systems and devices incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

As used herein, the terms "memory system" and "memory device" refer to systems and devices configured to temporarily and/or permanently store information related to various electronic devices. Accordingly, the term "memory device" can refer to a single memory die and/or to a memory package containing one or more memory dies. Similarly, the term "memory system" can refer to a system including one or more memory dies (e.g., a memory package) and/or to a system (e.g., a dual in-line memory module (DIMM)) including one or more memory packages.

Powerup sequencing of a memory system (e.g., of one or more DIMM, of one or more memory devices or packages, etc.) is a current-intensive operation. To limit peak current demand during powerup operations, conventional memory systems (e.g., conventional volatile memory systems) trigger an internally timed chain of events when an external powerup voltage is supplied to the memory systems. The chain of events is governed by multiple powerup signals, where the powerup signals are sequentially fired over time to activate various subsystems (e.g., voltage pumps, regulators, etc.) of all of the memory dies across the memory system. As the various subsystems of the memory dies come online, large spikes in the current demanded by the memory system remain visible in the powerup profile. The peak current demand is exacerbated as memory systems and devices are configured to include a greater number of memory dies and/or to generate a greater number of internal voltages within the memory dies.

To address this problem, several embodiments of the present technology are directed to memory devices (e.g., volatile memory devices), systems including memory devices (e.g., DIMM's), and methods of operating memory devices in which the powerup sequence operations of memory dies across a memory system and/or device are staggered or offset over time to reduce the peak current demand of the memory system. In particular, individual memory devices (e.g., individual memory dies, individual memory packages having one or more memory dies, etc.) are each assigned to one of a number of powerup groups associated with a specified time delay after an external powerup voltage is supplied to the memory system. At least one of the memory devices includes powerup group detect circuitry configured to determine the powerup group to which the memory device or a group of memory dies (e.g., a group of memory dies within a memory package) has been assigned. In turn, a memory device can delay the powerup sequence operations of its subsystems for a time associated with the powerup group to which it is assigned. In this manner, memory devices of a memory system can be powered on in staggered groups, thereby spreading the current draw of a memory system over time and reducing the peak current demand of the memory system on the power supply.

FIG. 1 is a block diagram schematically illustrating a memory system 100 (e.g., a dual in-line memory module (DIMM)) configured in accordance with various embodiments of the present technology. The memory system 100 can include a memory controller 101 (e.g., a field programming gate array (FPGA) or other suitable memory controller) and one or more memory devices 104 (e.g., one or more dynamic random-access memory (DRAM) device packages) electrically connected to the memory controller 101 via a printed circuit board (PCB) 102 (e.g., via one or more electrical contacts and/or traces). The memory controller 101 can be configured to control one or more operations of the memory system 100. For example, the memory controller 101 can coordinate the powerup sequencing operations of the memory devices 104. In particular, the controller 101 can direct one or more memory devices 104 of the memory system 100 to initiate their respective powerup sequencing operation. In some embodiments, the controller 101 can direct the one or more memory devices 104 to initiate their respective powerup sequencing operation when an external powerup voltage is supplied to the memory system 100.

[00.15] Individual memory devices 104 of the memory system 100 can include a package substrate 103 and one or more memory dies 200. As illustrated in FIG. 1, each of the memory devices 104 includes a first memory die 200a attached to the package substrate 103, and a second memory die 200b stacked on top of the first memory die 200a. In some embodiments, the first and second memory dies 200a and 200b are each electrically connected to the package substrate 103 (e.g., via one or more electrical contacts and/or traces), which in turn can be electrically connected to the PCB 102. Although the devices 104 illustrated in FIG. 1 are dual die packages (DDP), one or more memory devices 104 configured in accordance with other embodiments of the present technology can include a greater or lesser number of memory dies 200 (e.g., one memory die or more than two memory dies) than illustrated. In these and other embodiments, the orientation of the memory dies included in a memory device 104 can vary. For example, the first and second memory dies 200a and 200b illustrated in FIG. 1 are each oriented face down (e.g., toward the package substrate 103) in a back-to-face orientation. In other embodiments, the first memory die 200a and/or the second memory die 200b can be oriented face up (e.g., away from the package substrate 103) such that the first and second memory dies 202a and 202b are arranged in a face-to-back, face-to-face, and/or back-to-back orientation on a package substrate 103. In these and still other embodiments, the first and second memory dies 200a and 200b can be arranged side-by-side on the package substrate 103, as opposed to the stacked arrangement illustrated in FIG. 1.

In some embodiments, the memory system 100 can further include one or more resistors. In the embodiment illustrated in FIG. 1, the memory system 100 includes eight resistors R1-R8. The resistors R1-R8 are illustrated within the PCB 102. In other embodiments, one or more of the resistors R1-R8 can be positioned at other locations within the memory system 100. For example, one or more of the resistors R1-R8 can be positioned within one or more of the package substrates 130, within one or more of the memory dies 200 (e.g., within the first and/or second memory dies 200a and/or 200b), within the memory controller 101, and/or within another component (not shown) of the memory system 100.

Each one of the resistors R1-R8 corresponds to a respective one of the memory devices 104 and/or memory dies 200 of the memory system 100. In particular, the resistors R1-R8 can each be electrically connected to a powerup group terminal (not shown) of a respective memory device 104 and/or of a respective memory die 200. The resistive values of a first subset of the resistors R1-R8 can differ from the resistive values of a second subset of the resistors R1-R8 such that different voltages can be delivered to the powerup group terminals across the memory system 100. In these and other embodiments, one or more of the resistors can be variable resistors such that their resistive values can be changed, which in turn can change the voltage supplied to the powerup group terminal(s). As described in greater detail below, one or more of the memory dies 200 of the memory system 100 can include powerup group detect circuitry (not shown) to detect the voltages supplied to the powerup group terminals. In turn, the memory devices 104 and/or the memory dies 200 can determine a powerup group to which they are assigned and can delay the powerup sequence of its subsystems for a time associated with the powerup group to which it is assigned.

Although the memory system 100 is illustrated with eight resistors R1-R8 in FIG. 1 where each one of the resistors R1-R8 corresponds to a respective memory device 104 and/or memory die 200 of the memory system 100, the number of resistors included in the memory system 100 of other embodiments can vary. For example, memory systems 100 configured in accordance with other embodiments of the present technology can include a greater or lesser number of resistors (e.g., more or less than eight resistors total) and/or can include a greater or lesser number of resistors per memory device 104 and/or memory die 200 (e.g., zero or more than one resistor per memory die 200). In these and still other embodiments, the number of resistors per memory device 104 and/or memory die 200 can vary across the memory system 100.

[00.19] The memory system 100 can be connected to any one of a number of electronic devices that is capable of utilizing memory for the temporary or persistent storage of information, or a component thereof. For example, the memory system 100 can be operably connected to a host device (not shown). The host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to the memory system 100, although, in other embodiments, the host device may be indirectly connected to the memory system 100 (e.g., over a networked connection or through intermediary devices).

Figure 2:
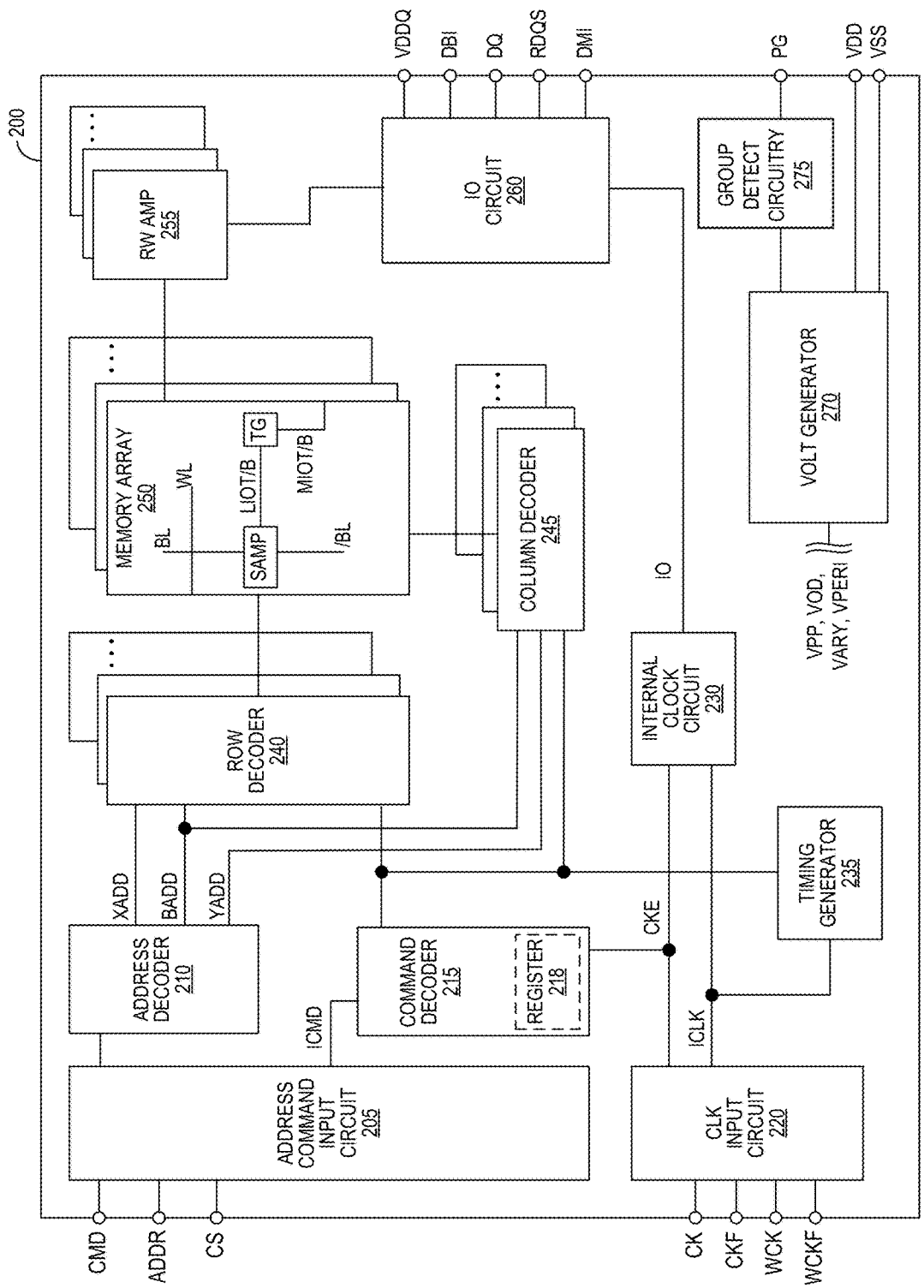
FIG. 2 is a block diagram schematically illustrating a memory device configured in accordance with various embodiments of the present technology.

FIG. 2 is a block diagram schematically illustrating a memory device 200 (e.g., a memory die 200, such as a first memory die 200a and/or a second memory die 200b of FIG. 1) configured in accordance with various embodiments of the present technology. The memory die 200 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI to receive data signals, power supply terminals VDD, VSS, and VDDQ, and a powerup group terminal PG to receive a powerup group signal.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a CKE signal from a command decoder 215, an input buffer can receive the CK and CKF signals and the WCK and WCKF signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable signal CKE from the command decoder 215. For example, the internal clock circuit 230 can include a clock path (not shown in FIG. 2) that receives the internal clock signal ICLK and provides various clock signals to the command decoder 215. The internal clock circuit 230 can further provide input/output (IO) clock signals. The IO clock signals can be supplied to an input/output (IO) circuit 260 and can be used as a timing signal for determining an output timing of read data and the input timing of write data. The IO clock signals can be provided at multiple clock frequencies so that data can be output from and input into the memory die 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated that can be used by the command decoder 215, the column decoder 245, and/or other components of the memory die 200.

The memory die 200 may include an array of memory cells, such as memory array 250. The memory cells of the memory array 250 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be a one or more memory banks or another arrangement of memory cells. In these and other embodiments, the memory regions of the memory array 250 can be arranged in one or more groups (e.g., groups of memory banks, one or more logical memory ranks or dies, etc.). Memory cells in the memory array 250 can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The command terminals and address terminals may be supplied with an address signal and a bank address signal from outside the memory die 200. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal (BADD) and supply the bank address signal to both the row decoder 240 and the column decoder 245.

The command and address terminals can be supplied with command signals CMD, address signals ADDR, and chip selection signals CS (e.g., from the memory controller 101 and/or a host device). The command signals may represent various memory commands (e.g., including access commands, which can include read commands and write commands). The select signal CS may be used to select the memory device 104 and/or the memory die 200 to respond to commands and addresses provided to the command and address terminals. When an active CS signal is provided to the memory die 200, the commands and addresses can be decoded and memory operations can be performed. The command signals CMD may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The internal command signals can also include output and input activation commands, such as a clocked command CMDCK (not shown) to the command decoder 215. The command decoder 215 may further include one or more registers 218 for tracking various counts or values.

When a read command is issued, and a row address and a column address are timely supplied with the read command, read data can be read from memory cells in the memory array 250 designated by the row address and the column address. The read command may be received by the command decoder 215, which can provide internal commands to the IO circuit 260 so that read data can be output from the data terminals DQ, RDQS, DBI, and DMI via read/write (RW) amplifiers 255 and the IO circuit 260 according to the RDQS clock signals. The read data may be provided at a time defined by read latency information RL that can be programmed in the memory die 200, for example, in a mode register (not shown in FIG. 2). The read latency information RL can be defined in terms of clock cycles of the CK clock signal. For example, the read latency information RL can be a number of clock cycles of the CK signal after the read command is received by the memory die 200 when the associated read data is provided.

When a write command is issued, and a row address and a column address are timely supplied with the command, write data can be supplied to the data terminals DQ, DBI, and DMI over DQ lines connected to the memory die 200 according to the WCK and WCKF clock signals. The write command may be received by the command decoder 215, which can provide internal commands to the IO circuit 260 so that the write data can be received by data receivers in the IO circuit 260, and supplied via the IO circuit 260 and the RW amplifiers 255 to the memory array 250 over IO lines of the memory die 200. The write data may be written in the memory cell designated by the row address and the column address. The write data may be provided to the data terminals at a time that is defined by write latency WL information. The write latency WL information can be programmed in the memory die 200, for example, in the mode register (not shown in FIG. 2). The write latency WL information can be defined in terms of clock cycles of the CK clock signal. For example, the write latency information WL can be a number of clock cycles of the CK signal after the write command is received by the memory die 200 when the associated write data is received.

The memory array 250 may be refreshed or maintained to prevent data loss, either due to charge leakage or imprint effects. A refresh operation, may be initiated by the memory die 200, by the memory system 100 (e.g., by the memory controller 101 of FIG. 1), and/or by a host device, and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory die 200 may be configured to refresh the same row of memory cells in every memory bank of the memory array 250 simultaneously. In another approach, the memory die 200 may be configured to refresh the same row of memory cells in every memory bank of the memory array 250 sequentially. In still another approach, the memory die 200 can further include circuitry (e.g., one or more registers, latches, embedded memories, counters, etc.) configured to track row (e.g., word line) addresses, each corresponding to one of the memory banks in the memory array 250. In this approach, the memory die 200 is not constrained to refresh the same row in each memory bank of the memory array 250 before refreshing another row in one of the memory banks.

Regardless of the refresh approach, the memory die 200 can be configured to refresh memory cells in the memory array 250 within a given refresh rate or time window (e.g., 32 ms, 28 ms, 25 ms, 23 ms, 21 ms, 18 ms, 16 ms, 8 ms, etc.). In these embodiments, the memory device 104 and/or the memory system 100 can be configured to supply refresh commands to the memory die 200 in accordance with a specified minimum cadence tREFI. For example, the memory device 104 and/or the memory system 100 can be configured to supply one or more refresh commands to the memory die 200 at least every 7.8 µs such that an approximate minimum of 4000 refresh commands are supplied to the memory die 200 within a 32 ms time window.

The power supply terminals of the memory die 200 may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in sense amplifiers included in the memory array 250 of the memory die 200, and the internal potential VPERI can be used in many other circuit blocks.

The power supply terminals may also be supplied with power supply potential VDDQ. The power supply potential VDDQ can be supplied to the IO circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 260 so that power supply noise generated by the IO circuit 260 does not propagate to the other circuit blocks.

As discussed above, powerup sequencing of a memory system and/or memory device (e.g., of the memory system 100 and/or of a memory device 104 illustrated in FIG. 1) is a current-intensive operation. To limit peak current demand during powerup operations, a conventional memory system triggers an internally timed chain of events when an external powerup voltage is supplied to the memory system. The chain of events is governed by multiple powerup signals (e.g., issued by a memory controller of the memory system), where the powerup signals are sequentially fired over time to activate various subsystems (e.g., voltage pumps, regulators, etc.) of all of the memory dies across the memory system. As the various subsystems of the memory dies come online, large current spikes remain visible in the powerup profile of the memory system. In addition, conventional memory devices (e.g., conventional volatile memory packages) are configured powerup all memory dies of the memory device simultaneously. Thus, a large current spike in the powerup profile of a memory device occurs as all of the memory dies of the memory device are powered on simultaneously.

Figure 3A:
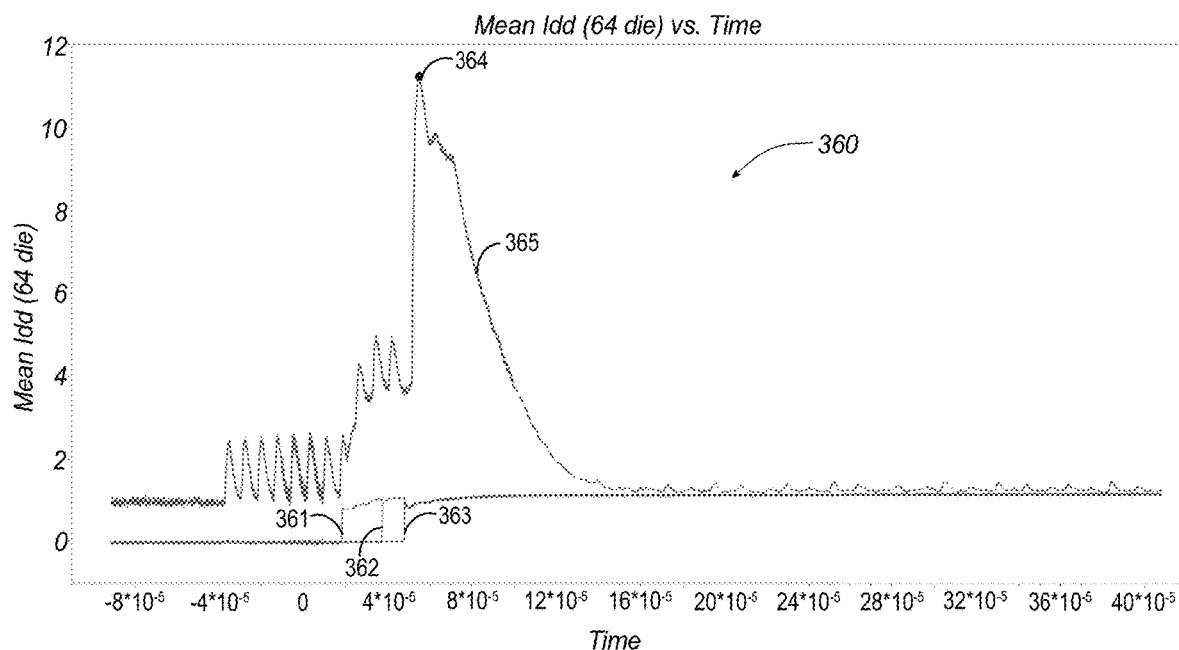
FIGS. 3A and 3B are line plots illustrating peak current draw during powerup of memory systems configured in accordance with embodiments of the present technology.

FIG. 3A is a line plot 360 of a current demand curve 365 illustrating current demand of a memory system over time during execution of a conventional powerup sequencing operation. The timing of three powerup signals 361, 362, and 363 is also illustrated in the line plot 360 under the current demand curve 365. As each of the powerup signals 361, 362, and 363 are fired, various subsystems across all of the memory dies of the memory system come online. As shown in FIG. 3A, the current demand during the powerup sequence operation of the memory system peaks at point 364 along the current demand curve 365, shortly after the powerup signal 363 is fired. This peak current represents a momentary maximum amount of current demanded from the power supply by the various subsystems of all the memory dies across the memory system. As memory systems and devices are configured to include a greater number of memory dies and/or to generate a greater number of internal voltages within each memory die during powerup sequence operations, the peak current demanded by the memory system will increase.

Referring again to FIG. 2, one or more memory dies 200 configured in accordance with several embodiments of the present technology can include powerup group detect circuitry 275 to address this concern. As shown, the group detect circuitry 275 can be electrically coupled to the powerup group terminal PG of the memory die 200 and/or of a memory device 104. In some embodiments, the powerup group terminal PG can be tied to a polarity (e.g., a polarity corresponding to "0" or "1") or can be left floating. In these and other embodiments, the voltage delivered to the powerup group terminal PG can be dependent on one or more resistors electrically connected to the powerup group terminal PG, such as one or more of the resistors R1-R8 illustrated in FIG. 1.

In some embodiments, the group detect circuitry 275 can include one or more buffers, comparators, analog-to-digital circuits, and/or other hardware components configured to determine a powerup group of the memory die 200 based upon one or more signals received at the powerup group terminal PG of the memory die 200. For example, the group detect circuitry 275 can determine whether the powerup group terminal PG is tied to a polarity, to determine to which polarity the powerup group terminal PG is tied, and/or to determine a voltage level supplied to the powerup group terminal PG. Based, at least in part, on one or more of these determinations, the group detect circuitry 275 can determine to which powerup group the memory die 200 is assigned and can delay the powerup sequence operations of the memory die 200 by an amount of time corresponding to the assigned powerup group. In other words, the memory system 100 can assign memory dies 200 to a powerup group using the powerup group terminals PG of the memory dies 200. In this manner, the memory system 100 can (e.g., uniformly or nonuniformly) stagger or offset the powerup sequence operations of groups of memory dies 200 over time, which can distribute the current demanded by the memory system over time and can reduce the peak current demand of the memory system on the power supply.

In some embodiments, the values of the resistors are adjustable such that a memory die 200 can be reassigned to a different powerup group. In these and other embodiments, whether a powerup group terminal PG is tied to a polarity and/or the polarity to which the powerup group terminal PG of a memory die 200 is tied can be changed such that the memory die 200 can be reassigned to a different powerup group. In these and still other embodiments, the powerup groups associated with each of the resistor values, polarities, and/or floating powerup group terminals PG can be changed to reassign the memory dies 200 to different powerup groups.

Figure 3B:
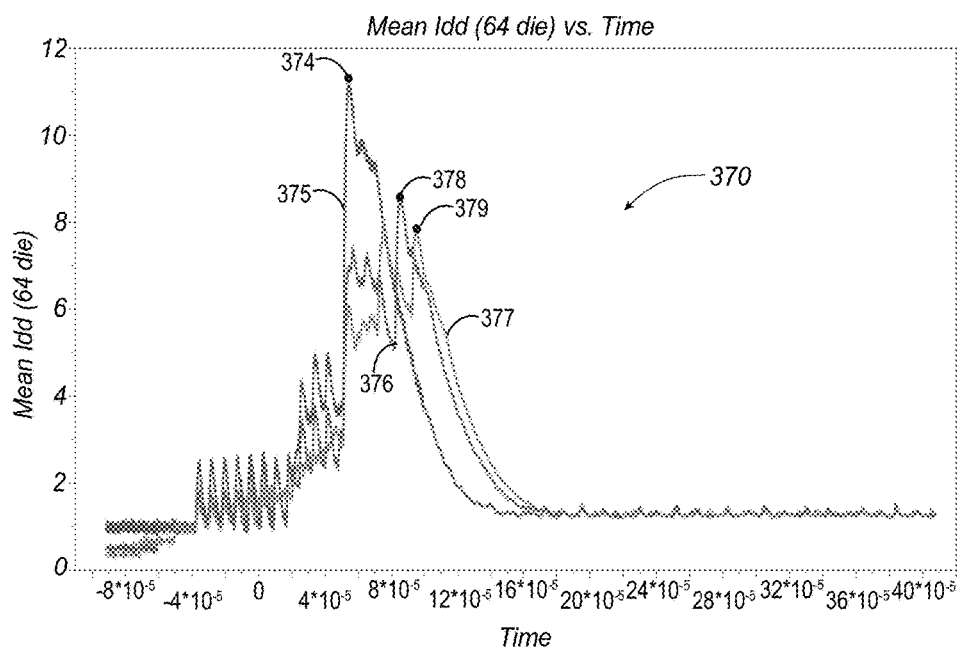

FIG. 3B is a line plot 370 of current demand curves 375-377 illustrating current demand of a memory system over time during execution of a powerup sequencing operation. In particular, the current demand curve 375 illustrated in FIG. 3B is the current demand curve 365 illustrated in FIG. 3A and corresponds to a scenario in which all memory dies across the memory system bring their subsystems online at the same time (e.g., a scenario in which the powerup sequence operations of the memory dies are not staggered or offset). In contrast, the current demand curve 376 corresponds to a scenario in which (i) half of the memory dies of the memory system are assigned to a first powerup group and do not delay their powerup sequence operations, and (ii) the other half of the memory dies are assigned to a second powerup group and delay their powerup sequence operations by 30 µs. As shown in FIG. 3B, delaying the powerup sequence operations of half of the memory dies by 30 µs reduces the peak current demand (shown at point 378 along the curve 376) of the memory system on the power supply by approximately 23% relative to the peak current demand (shown at point 374 along the curve 375) of the memory system without staggering the powerup sequence operations of any of the memory dies.

In some embodiments, the memory system can further reduce the peak current demand by separating the memory dies into more than two powerup groups. For example, the current demand curve 377 illustrated in FIG. 3B corresponds to a scenario in which (i) a first third of the memory dies are assigned to a first powerup group and do not delay their powerup sequence operations, (ii) a second third of the memory dies are assigned to a second powerup group and delay their powerup sequence operations by 20 µs, and (iii) a last third of the memory dies are assigned to a third powerup group and delay their powerup sequence operations by 40 µs. In other words, three powerup groups are offset by 20 µs from one another. As shown in FIG. 3B, staggering the powerup sequence operations of groups of memory dies by 20 µs reduces the peak current demand (shown at point 379 along the curve 377) of the memory system on the power supply by approximately 28% relative to the peak current demand (shown at point 374 along the curve 375) of the memory system without staggering the powerup sequence operations of any of the memory dies. As described in greater detail below, the number of powerup groups and the corresponding delay(s) can be optimized on a per-design basis and can remain within a timing specification (e.g., a time limit imposed by a datasheet specification in which the memory dies are required to be functional after an external powerup voltage is supplied to the memory system).

In some embodiments, a memory system can assign powerup groups to individual memory dies 200 across the memory system (e.g., using powerup group detect circuitry 275 and/or powerup group terminals PG of one or more memory dies 200). In these and other embodiments, a memory system can assign memory dies 200 to one of a plurality of powerup groups by memory device 104. For example, one or more memory dies 200 of a memory device 104 can include powerup group detect circuitry 275 and a powerup group terminal PG. In these embodiments, the one or more memory dies 200 can be configured to detect powerup group(s) for the memory device 104 (e.g., powerup group detect circuitry 275 of an individual memory die 200 can detect a powerup group assigned to all or a subset of the memory dies 200 of the memory device 104). In other words, the memory system can assign individual memory devices 104 to a powerup group using the powerup group terminal PG and the powerup group detect circuitry of the memory devices 104 (e.g., of the one or more memory dies 200).

In these and other embodiments, a memory system 100 and/or a memory device 104 can be configured to assign individual memory dies 200 of the memory device 104 to one of a plurality of powerup groups. For example, at least one memory die 200 (e.g., a first memory die 200a) of the memory device 104 can include powerup group detect circuitry 275 configured to detect a powerup group signal delivered to a powerup group terminal PG of the at least one memory die 200. In these embodiments, the memory device 104 can assign the first memory die 200a to a first powerup group using the powerup group detect circuitry 275 and the powerup group terminal PG of the first memory die 200a and assign a second memory die 200b of the memory device 104 to a second powerup group (e.g., using powerup group detect circuitry 275 and/or a powerup group terminal PG of the second memory die 200, or a lack thereof).

Additionally, or alternatively, a memory system and/or a memory device can assign individual memory dies to one of a plurality of powerup groups using other methods. For example, a memory device 104 can assign individual memory dies 200 to one of a plurality of powerup groups using static delays, control signals from other memory dies, and/or other metal options. As a specific example, a first memory die 200a of a memory device 104 can be assigned to a first powerup group and a second memory die 200b can be assigned to a second powerup group. As the memory device 104 powers on (e.g., when an external voltage is supplied to the memory device 104), the first memory die 200a can begin its powerup sequencing operations, and, sometime thereafter, the second memory die 200b can begin its powerup sequencing operations. The staggering of the powerup sequencing operations of the first memory die 200a and the second memory die 200b can be achieved via a control signal. The control signal can be static delay, or the control signal can be a signal sent from the first memory die 200a to the second memory die 200b following powerup of the first memory die 200a and/or based on VDD and VPP supplied to the power supply terminals and/or generated by the voltage generator circuit 270. In embodiments that base powerup timing of a second memory die 200b on a control signal generated by a first memory die 200a of the memory device 104, relative timing between the powerup sequence operations of the first and second memory dies 200a and 200b can be changed based on VDD/VPP ramp rate. In contrast, adding a static delay in the powerup of the second memory die 200b rather than sending a control signal from the first memory die 200a to the second memory die 200b ensures that the relative timing between the powerup sequence operations of the first and second memory dies 200a and 200b remains unchanged when the VDD/VPP ramp rate changes. In some embodiments, the staggering between powerup operations of two or more memory dies 200 can be tailored specific to the powerup current profile of each memory device 104.

Figure 4A:
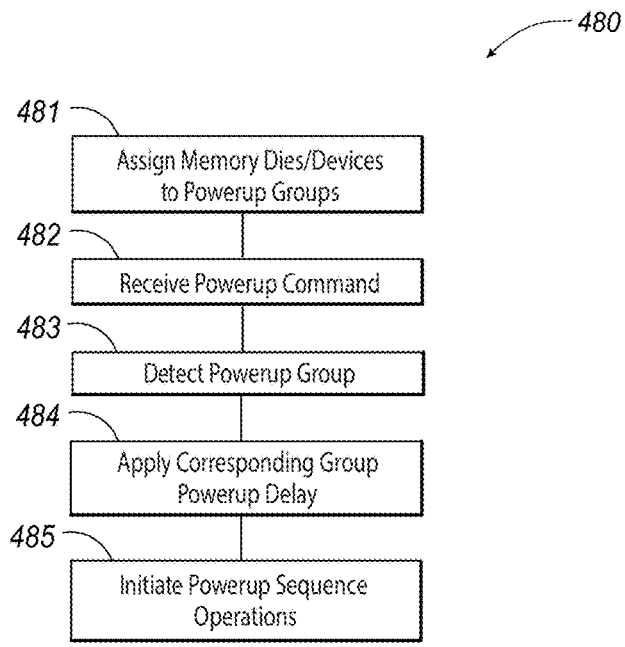
FIGS. 4A and 4B are flow diagrams illustrating routines of a memory system configured in accordance with various embodiments of the present technology.

FIG. 4A is a flow diagram illustrating a powerup routine 480 of a memory system configured in accordance with various embodiments of the present technology. In some embodiments, the routine 480 can be executed, at least in part, by various components of the memory system. For example, one or more steps of the routine 480 can be executed, at least in part, by a memory controller, a PCB, a memory device, a package substrate, and/or a memory die (e.g., by powerup group detect circuitry, by a voltage generator, by a command decoder, etc. of the memory die). In these and other embodiments, one or more steps of the routine 480 can be executed, at least in part, by a host device operably connected to the memory system, by a manufacturer, by an end user, or by an intermediary party.

The routine 480 can begin at block 481 by assigning memories dies and/or devices of the memory system to one of at least two powerup groups. In some embodiments, the routine 480 can assign a memory die to a powerup group by tying a powerup group terminal of the memory die to a polarity (e.g., a polarity corresponding to a first state "0" or a second state "1") or by leaving the powerup group terminal floating. In these and other embodiments, a voltage supplied to a powerup group terminal of a memory device can be used to assign the memory die to a powerup group. For example, a voltage supplied to a powerup group terminal of a first memory die can differ from a voltage supplied to the powerup group terminal of a second memory die, thereby assigning the first memory die to a different powerup group than the second memory die. In some embodiments, different voltages can be supplied to the powerup group terminals of different memory dies by electrically connecting one or more resistors of differing values to the powerup group terminals (e.g., external to the memory dies).

At block 482, the routine 480 can receive a powerup command. In some embodiments, the powerup command can be an external powerup voltage received at the memory system. In these and other embodiments, the powerup command can be a voltage applied to one or more of the power supply terminals of a memory die. In these and still other embodiments, the powerup command can be a command issued by a memory controller of the memory system (e.g., in response to an external powerup voltage applied to the memory system).

At block 483, the routine 480 can detect a powerup group to which a memory die is assigned. In some embodiments, the routine 480 can detect a powerup group in response to receiving the powerup command at block 482. In these and other embodiments, the routine 480 can detect a powerup group using powerup group detect circuitry of the memory die. For example, in embodiments where a memory die is assigned to a powerup group by tying a powerup group terminal of the memory die to a polarity or by leaving the powerup group terminal floating, the routine 480 can detect to which powerup group the memory die is assigned by using the group detect circuitry (a) to determine whether the powerup group terminal of the memory die is tied to a polarity and/or (b) to determine to which polarity the powerup group terminal is tied. For example, the routine 480 can attempt to drive the powerup group terminal of the memory die high (e.g., to a polarity corresponding to a second state "1") and/or can attempt to drive the powerup group terminal of the memory die low (e.g., to a polarity corresponding to a first state "0"). If the routine 480 determines that a large amount of current is required to drive the powerup group terminal in one direction (e.g., relative to the current required to drive the powerup group terminal in the other direction), the routine 480 can determine that the powerup group terminal is (a) tied to a polarity and/or (b) tied to a polarity opposite the direction that required the greatest amount of current. On the other hand, if the routine 480 is able to drive the powerup group terminal high and low with a relatively small amount of current, the routine 480 can determine that the powerup group terminal of the memory die is floating.

Based on the determination of whether the powerup group terminal of a memory die is tied to a polarity and/or on the determination of to which polarity the powerup group terminal is tied, the routine 480 can determine a powerup group to which the memory die is assigned. In some embodiments, for example, the routine 480 can determine (i) that the memory die is assigned to a first powerup group when the powerup group terminal of the memory die is tied to either polarity, and (ii) that the memory die is assigned to a second powerup group when the powerup group terminal is floating.

In other embodiments, the routine 480 can determine (i) that the memory die is assigned to a first powerup group when the powerup group terminal is tied to a first polarity, (ii) that the memory die is assigned to a second powerup group when the powerup group terminal is tied to a second polarity, and (iii) that the memory die is assigned to a third powerup group when the powerup group terminal is floating.

In embodiments where the voltage supplied to the powerup group terminal of the memory die assigns the memory die to a powerup group, the routine 480 can determine the value of the resistor(s) (if any) electrically connected to a powerup group terminal of a memory die using powerup group detect circuitry of the memory die. Based on the determined value of the resistor(s) (e.g., based on the voltage supplied to the powerup group terminal of a memory die), the routine 480 can determine a powerup group to which the memory die is assigned.

In some embodiments, memory dies of a memory system can be assigned to powerup groups at the time of manufacture or testing of the system (or of its components), and/or the assignments can remain unchanged for the life of the memory system (or of one of its components). In these embodiments, the routine 480 can be configured to detect a powerup group of a memory die the first time a memory is powered on and to store this information for use in futures instances where the memory die is powered on. In these and other embodiments, the powerup group assignments can be changed (e.g., by varying the resistance values electrically connected to the powerup group terminals of the memory dies, by changing the polarity to which the powerup group terminals are tied, by changing the associations of powerup groups with voltage values and/or polarities, etc.). In these and other embodiments, the routine 480 can be configured to detect a powerup group assignment of the memory die each time the memory die is powered on, after a certain amount of time has elapsed, and/or a certain number of events (e.g., powerup sequence operations) have occurred.

At block 484, the routine 480 can delay powerup sequence operations of a memory die by a time corresponding to a powerup group to which the memory die is assigned (e.g., determined at block 483). In some embodiments, the delay corresponding to each powerup group can be defined during manufacture of the memory system (or its components). In these and other embodiments, the delay corresponding to each powerup group can be programmable. For example, delay elements per powerup group can be configurable via metal options in a PCB or a package substrate. In these embodiments, the routine 480 can adjust or revise a previously defined delay corresponding to each powerup group using the metal or circuit options in the PCB or the package substrate (e.g., to fine-tune or to revise or alter the delays based on system data). In these and other embodiments, the staggering of powerup groups can be optimized on a per-design basis. The staggering can be uniform or nonuniform. In these and still other embodiments, the staggering of the powerup groups can be defined such that all or a subset of the memory dies of a memory system are functional within a time limit imposed by a datasheet specification (e.g., within a time limit that starts when an external powerup voltage is supplied to the memory system). In these and still other embodiments, the duration of a delay corresponding to a powerup group can be measured from any one or more of the following events: (a) the time an external powerup voltage is supplied to the memory system (or one of its components); (b) the time any one or more of the powerup signals are issued by the memory controller of the memory system; and/or (c) the time one or more components of the memory die or one or more other components of the memory system (e.g., memory dies of another powerup group) come online or initiate their powerup sequencing operations.

At block 485, the routine 480 can initiate the powerup sequence operation(s) of the memory die. For example, the routine 480 can initiate the powerup sequence operation(s) of the memory die after an amount of time corresponding to the delay determined at block 484 has elapsed. In these and other embodiments, the routine 480 can initiate the powerup sequence operation(s) of the memory die using, at least in part, the powerup group detect circuitry and a voltage generator of the memory die.

Figure 4B:
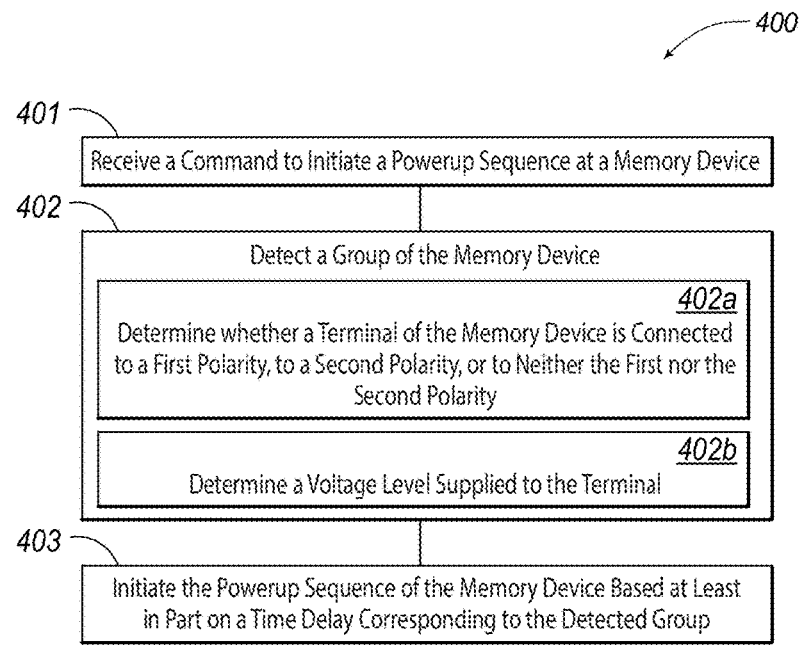

FIG. 4B is a flow diagram illustrating a routine 400 of a memory system configured in accordance with various embodiments of the present technology. In some embodiments, the routine 400 can be executed, at least in part, by various components of the memory system. For example, one or more steps of the routine 400 can be executed, at least in part, by a memory controller, a PCB, a memory device, a package substrate, and/or a memory die (e.g., by circuitry, by a voltage generator, by a command decoder, etc. of the memory die). In these and other embodiments, one or more steps of the routine 400 can be executed, at least in part, by a host device operably connected to the memory system, by a manufacturer, by an end user, or by an intermediary party.

The routine 400 begins at block 401 by receiving a command to initiate a powerup sequence at a memory device. The memory device can be a memory device of a plurality of memory devices of a memory system. In some embodiments, the memory device is a single memory die. In other embodiments, the memory device includes two or more memory dies, such as a first memory die and a second memory die. In some embodiments, memory dies of the memory device share terminals and/or circuitry associated with a powerup sequence of the memory dies and/or of the memory device. In other embodiments, a memory die of the memory device can have its own dedicated terminal(s) and/or circuitry associated with a powerup sequence of the memory die and/or of the memory device. In some embodiments, the command can be an external voltage received at the memory device and/or at the memory system. For example, the command can be a voltage applied to a terminal of the memory device. As another example, the command can be a command issued by a memory controller of the memory system (e.g., in response to an external voltage applied to the memory system).

At block 402, the routine 400 detects a group of the memory device. In some embodiments, each of a plurality of memory devices belong to one of a plurality of groups, where each group is associated with a different time delay for initiating a powerup sequence for memory devices of the group. In some embodiments, detecting the group of the memory device includes determining whether a terminal of the memory device is connected to a first polarity, a second polarity, or to neither the first nor the second polarity (block 402a). The terminal can be associated with the powerup sequence of the memory device. In some embodiments, the routine 400 makes this determination by driving the terminal of the memory device high, by driving the terminal of the memory device low, or both.

In some embodiments, the routine 400 determines that the group of the memory device is a first group when the terminal is connected to either the first polarity or the second polarity. In these and other embodiments, the routine 400 determines that the group of the memory device is a second group when the terminal is not connected to either the first polarity or the second polarity. In other embodiments, the routine 400 determines that the group of the memory device is a first group when the terminal is connected to the first polarity, that the group of the memory device is a second group when the terminal is connected to the second polarity, and/or that the group of the memory device is a third group when the terminal is not connected to either the first polarity or the second polarity.

Additionally, or alternatively, detecting the group of the memory device includes determining a voltage level supplied to at least one terminal of the memory device (block 402b). The at least one terminal can be associated with the powerup sequence of the memory device. In some embodiments, the at least one terminal of the memory device includes the terminal of the memory device discussed above with respect to block 402a. In these and other embodiments, the at least one terminal of the memory device includes one or more terminals of the memory device different than the terminal of the memory device discussed above with respect to block 402a. In some embodiments, at least one resistor is electrically connected to the at least one terminal of the memory device and is configured to affect a voltage level supplied to the at least one terminal of the memory device.

In some embodiments, the routine 400 makes the determination at block 402a and/or the determination at block 402b using circuitry of the memory device. The circuitry can be electrically connected to one or more terminals of the memory device. In some embodiments, the circuitry includes a comparator, an analog-to-digital converter, or both. In embodiments where the memory device includes two or more memory dies, the routine 400 can detect a group of all or a subset of the memory dies. For example, to detect the group of the memory device, the routine 400 can detect a first group of a first memory die of the memory device and detect a second group of a second memory die of the memory device.

At block 403, the routine 400 initiates the powerup sequence of the memory device based at least in part on a time delay corresponding to the detected group(s) of the memory device. In embodiments where the memory device includes two or more memory dies, the routine 400 can initiate a first powerup sequence of a first memory die in a first group based at least in part on a first time delay corresponding to the first group, and can initiate a second powerup sequence of the second memory die in a second group based at least in part on a second time delay corresponding to the detected second group. In some embodiments, the first time delay and the second time delay are the same. In other embodiments, the first time delay and the second time delay are different. In some embodiments, the time delay corresponding to the first group and/or the second group is greater than zero seconds (0s). In these and other embodiments, the time delays corresponding to groups of memory dies and/or devices stagger initialization of a powerup sequence of each group by a uniform or nonuniform amount of time.

Although the steps of the routine 480 and the routine 400 are discussed and illustrated in a particular order, the methods illustrated by the routine 480 and the routine 400 in FIG. 4A and FIG. 4B, respectively, are not so limited. In other embodiments, the methods can be performed in a different order. For example, any of the steps of the routine 480 and/or of the routine 400 can be performed before, during, and/or after any of the other steps of the routine 480 and/or of the routine 400. Moreover, a person of ordinary skill in the relevant art will readily recognize that the illustrated methods can be altered and still remain within these and other embodiments of the present technology. For example, one or more steps of the routine 480 illustrated in FIG. 4A and/or of the routine 400 illustrated in FIG. 4B can be omitted and/or repeated in some embodiments. In some embodiments, all or a subset of some or all of the steps of the routine 480 and/or of the routine 400 can be combined.

Figure 5:
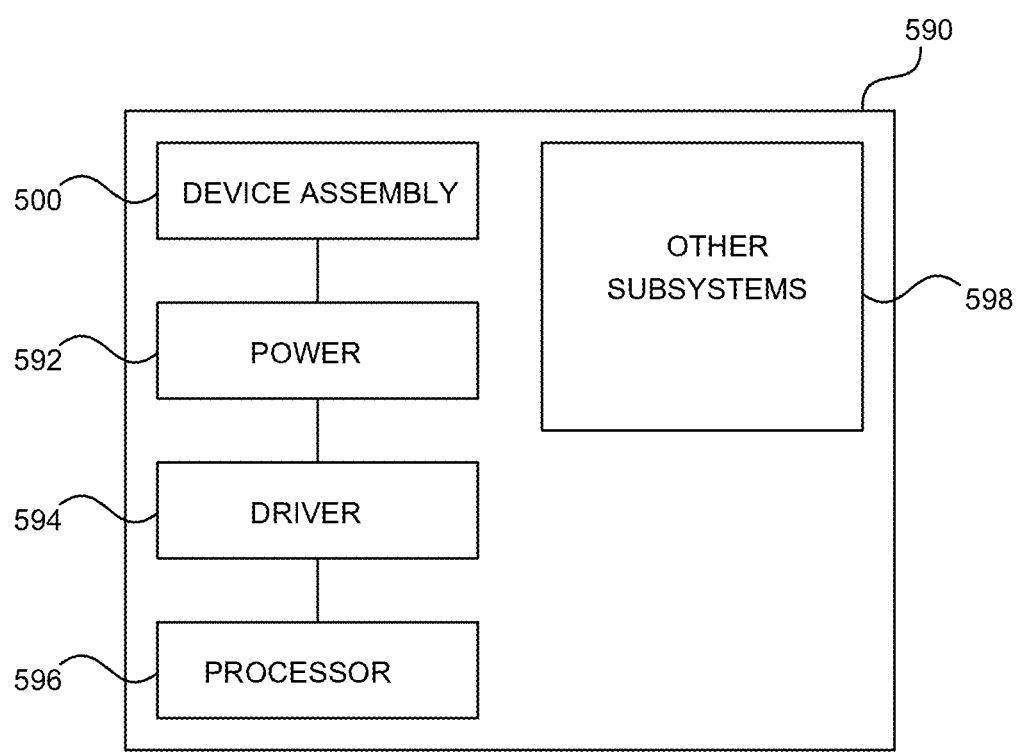
FIG. 5 is a schematic view of a system that includes a memory device configured in accordance with various embodiments of the present technology.

FIG. 5 is a schematic view of a system that includes a memory device configured in accordance with various embodiments of the present technology. Any one of the foregoing memory systems, devices, and/or dies described above with reference to FIGS. 1-4B can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory systems, devices, and/or dies described above with reference to FIGS. 1-4B, and can, therefore, include various features of configurable die powerup delay. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded. As used herein, the phrase "and/or" as in "A and/or B" refers to A alone, B alone, and both A and B.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory system, comprising:
a first memory device and a second memory device, wherein:
the first memory device includes circuitry configured to detect a powerup group to which the first memory device and/or the second memory device belongs based at least in part on a first signal received at a terminal corresponding to the first memory device, and
the first signal is a separate signal from a command to initiate a powerup sequence.

2. The memory system of claim 1, wherein, after receiving the command to initiate the powerup sequence, the first memory device is configured to delay initiating a powerup sequence of the first memory device by a time delay corresponding to the detected powerup group.

3. The memory system of claim 2, wherein the time delay is greater than zero seconds.

4. The memory system of claim 1, wherein, to detect the powerup group, the circuitry is configured to determine whether the terminal is connected to a first polarity or a second polarity.

5. The memory system of claim 4, wherein the circuitry is further configured to (a) determine that the powerup group of the first memory device and/or the second memory device is a first group when the terminal is connected to either the first polarity or the second polarity, or (b) determine that the powerup group of the first memory device and/or the second memory device is a second group when the terminal is not connected to either the first polarity or the second polarity, or (c) both.

6. The memory system of claim 4, wherein the circuitry is further configured to (a) determine that the powerup group of the first memory device and/or the second memory device is a first group when the terminal is connected to the first polarity, (b) determine that the powerup group of the first memory device and/or the second memory device is a second group when the terminal is connected to the second polarity, or (c) determine that the powerup group of the first memory device and/or the second memory device is a third group when the terminal is not connected to either the first polarity or the second polarity, or (d) any combination thereof.

7. The memory system of claim 1, wherein:
the first signal indicates the powerup group of the first memory device and/or the second memory device via a voltage level; and
to detect the powerup group of the first memory device and/or the second memory device, the circuitry is configured to determine the voltage level supplied to the terminal.

8. The memory system of claim 7, further comprising at least one resistor electrically connected to the terminal, wherein the at least one resistor is configured to affect the voltage level supplied to the terminal.

9. The memory system of claim 1, wherein the first memory device includes two or more memory dies, and wherein at least one of the two or more memory dies includes at least a portion of the circuitry.

10. The memory system of claim 1, wherein the first memory device is a first individual memory die, the second memory device is a second individual memory die, or both.

11. The memory system of claim 1, wherein:
the circuitry is first circuitry and the powerup group is a first powerup group;
the first circuitry is configured to detect the first powerup group to which the first memory device belongs based at least in part on the first signal received at the terminal corresponding to the first memory device;
the second memory device includes second circuitry different from the first circuitry; and
the second circuitry is configured to detect a second powerup group to which the second memory device belongs.

12. A memory device, comprising:
circuitry configured to detect a powerup group to which the memory device is assigned based at least in part on a signal received at a terminal associated with the memory device,
wherein the signal is a separate signal from a command to initiate a powerup sequence.

13. The memory device of claim 12, wherein, after receiving the command to initiate the powerup sequence, the memory device is configured to delay initiating a powerup sequence of the memory device by a time delay corresponding to the detected powerup group.

14. The memory device of claim 13, wherein the time delay is greater than zero seconds.

15. The memory device of claim 12, wherein:
the memory device is a first memory device; and
the circuitry is further configured to detect a group to which a second memory device is assigned based at least in part on the signal.

16. The memory device of claim 12, wherein:
the memory device includes a first memory die and a second memory die;
the first memory die includes the circuitry; and
the circuitry is configured to detect a group to which the first memory die and/or the second memory die is assigned based at least in part on the signal.

17. The memory device of claim 12, wherein the circuitry is configured to detect the powerup group based at least in part on a voltage level of the signal received at the terminal.

18. The memory device of claim 12, wherein:
to detect the powerup group, the circuitry is configured to determine whether the terminal is connected to a first polarity or a second polarity; and
the circuitry is further configured to (a) determine that the powerup group is a first group when the terminal is connected to either the first polarity or the second polarity, or (b) determine that the powerup group is a second group when the terminal is not connected to either the first polarity or the second polarity, or (c) both.

19. The memory device of claim 12, wherein:
to detect the powerup group, the circuitry is configured to determine whether the terminal is connected to a first polarity or a second polarity; and
wherein the circuitry is further configured to (a) determine that the powerup group is a first group when the terminal is connected to the first polarity, (b) determine that the powerup group is a second group when the terminal is connected to the second polarity, or (c) determine that the powerup group is a third group when the terminal is not connected to either the first polarity or the second polarity, or (d) any combination thereof.

20. The memory device of claim 12, wherein the memory device is an individual memory die.

* * * * *